United States Patent [19]
Smith

[11] Patent Number: 6,014,554
[45] Date of Patent: Jan. 11, 2000

[54] METHOD AND APPARATUS FOR TUNING ANALOG FILTERS

[75] Inventor: Malcolm H. Smith, Macungie, Pa.

[73] Assignee: Lucent Technologies, Inc., Murray Hill, N.J.

[21] Appl. No.: 08/941,336

[22] Filed: Sep. 30, 1997

[51] Int. Cl.$^7$ ..................................... H04B 1/16
[52] U.S. Cl. .................. 455/340; 455/266; 333/17.1
[58] Field of Search .................... 455/93, 142, 266, 455/340, 226.1, 195.1, 191.1, 77; 330/305; 333/17.1

[56] References Cited

U.S. PATENT DOCUMENTS

| | | | |
|---|---|---|---|
| 4,207,531 | 6/1980 | Ito | 455/164.1 |
| 4,453,258 | 6/1984 | Richardson | 375/345 |
| 5,281,931 | 1/1994 | Bailey et al. | 333/17.1 |
| 5,448,769 | 9/1995 | Jantti | 455/115 |
| 5,612,975 | 3/1997 | Becker et al. | 455/307 |
| 5,625,316 | 4/1997 | Chambers et al. | 327/553 |
| 5,822,687 | 10/1998 | Bickley et al. | 455/226.1 |
| 5,845,200 | 12/1998 | Suzuki et al. | 455/195.1 |

*Primary Examiner*—Reinhard J. Eisenzopf
*Assistant Examiner*—Charles N. Appiah
*Attorney, Agent, or Firm*—Synnestvedt & Lechner LLP

[57] ABSTRACT

A method and apparatus for tuning an analog filter that is embodied in a larger circuit in which the analog input signal to the filter is, at some point prior to the filter, in digital form. The digital version of the input signal to the filter is stored in memory. The output signal from the filter corresponding to the stored input signal is digitized and compared to the stored digital input signal to the filter. Based on the known input signal and the known desired frequency characteristics of the filter, the desired output signal is a known quantity. If the actual output signal differs from the expected output signal, the filter is tuned accordingly. The process may be performed continually on all input data or on discrete sections of the input data.

37 Claims, 3 Drawing Sheets

6,014,554

METHOD AND APPARATUS FOR TUNING ANALOG FILTERS

FIELD OF THE INVENTION

The invention pertains to frequency tuning of analog filters.

BACKGROUND OF THE INVENTION

In many of the applications in which they may be used, analog filters require repeated tuning while in operation in the field. Such applications include cellular telephones, high fidelity audio equipment, multi-media computers, and sensors. In other applications, analog filters may require a one-time tuning after fabrication is completed, which tuning may be performed by trimming immediately after fabrication or at a later time by an original equipment manufacturer (OEM) prior at come point prior to final packaging of the equipment. Particularly, it is difficult to precisely match resistors and capacitors during fabrication of integrated circuit chips. Variations from chip to chip of resistance and capacitance values can range as high as 20 percent. Since the frequency characteristics of a filter are primarily dependent upon the values of the resistors and capacitors comprising the filter, the frequency characteristics of a filter at the end of fabrication may not meet the tolerance requirements for the given application. Accordingly, it is frequently necessary to fine tune filters after fabrication is completed.

One method for implementing filters so that tuning can be avoided is to use switched capacitor filters which emulate a continuous time filter (i.e., an analog filter). These do not require tuning as their performance is dependent of the ratio of capacitors and the clock frequency. However, switched capacitor filters require clock rates considerably higher than the operating band width of the filter (e.g., anywhere from about 5 to 100 times faster). Thus, they require operational amplifiers with a commensurately wider band width and, hence, larger power consumption and area requirements. Also, the transistors used in the switches do not operate well at low supply voltages because the switches have too much resistance associated with them. Thus, the internal nodes do not settle and filter response suffers.

With respect to portable electronic equipment, such as cellular telephones, pagers, lap top computers, etc., there is a drive towards using lower voltages in order to conserve power and, thus, increase battery charge life before a recharge or battery replacement is necessary. However, as the operational voltages for the components get lower and lower, it sometimes causes problems in operation because transistors which require a minimum voltage to turn on (or off) are not receiving the voltages necessary to turn them fully on (or off). This problem may result in even further variation in frequency response of filters.

While, in some applications, a one-time post-fabrication tuning may be adequate, component characteristics also commonly drift over time during operation causing further changes to the frequency response characteristics of the filter. Accordingly, in many applications, it is desirable to fine tune analog filters repeatedly over time while they are in use in the field. There are several known ways of tuning filters after fabrication and/or repeatedly during field operation. One well-known scheme involves trimming of the resistors and/or capacitors forming the filter after fabrication, but before installation in its application environment. Trimming, however, is disadvantageous in that it increases manufacturing cost and time and is a one-time tuning that does not allow for further tuning in the field as the circuit components age.

Other known schemes involve the use of multiple, identical analog filters. In one such multiple identical filter implementation, a first filter is in operation filtering the actual data, while a second, identically fabricated filter is being tuned. The second filter is tuned by placing a known test pattern at its input and reading the filter output in response thereto to determine the filter's frequency characteristics. The filter under test is tuned to cause its frequency characteristics to more closely match the desired characteristics. Then the two filters are switched so that the second filter that was just tuned now operates on the actual data, while the first filter receives the test patterns and is tuned. The alternate functions of the two filters are switched at regular intervals in order to assure that the filter which is operating on the actual data is regularly corrected as necessary.

In another dual matched analog filter implementation known as a master/slave implementation, one filter, the slave, is always utilized in connection with the actual data and the other filter, the master, is constantly undergoing testing for tuning purposes. Both the master and slave filters will be tuned identically and simultaneously based on the test results for the master filter. One disadvantage of multiple filter tuning implementations is that they double the number of filters and, hence, increase area and power requirements. The master/slave scheme is further disadvantageous in that the master and slave filters may not be perfectly matched. Thus, the tuning which is effective for appropriately setting the characteristics of the master filter may not place the slave filter (the one that is operating on the actual data) to the correct characteristics.

Co-pending U.S. patent application Ser. No. 08/502,591, assigned to the same assignee as the present application and incorporated herein by reference, discloses another method and apparatus for frequency tuning of continuous-time or analog filters. Particularly, a switch is provided at the input of an analog filter in order to allow the input to be alternately connected to either the actual input signal (normal mode operation) or a test signal (test mode operation). When in the test mode, the output of the filter is coupled to a processor which analyzes the output in response to the input test signal to determine the frequency characteristics of the filter. The processor then controls the filter to tune it responsive to the difference between the expected filter output responsive to the test signal and the actual output of the filter.

Particularly, for a low pass filter, the test signal comprises a DC signal followed by a sinusoidal AC signal at the desired cut-off frequency of the filter, i.e., the −3 dB (decibel) point. During test, first the DC signal is applied and the filter output stored in memory and then the AC signal is applied and the filter output stored in memory. The two values are compared to determine if the AC signal is three decibels lower than the DC signal and, if not, the filter is tuned accordingly.

SUMMARY OF THE INVENTION

The present invention is particularly adapted for, but not limited to, use in any device in which the analog input signals to tunable analog filters are converted from digital to analog form prior to input to the filter. In accordance with the invention, the actual data signal that is applied to the input of the tunable analog filter, or a discrete time portion thereof, is stored in a memory in digital form prior to being converted to analog form for input to the filter. The digital signal is then converted to analog form by a digital to analog converter and passed through the filter. The output signal of the filter, in addition to being used for whatever purposes it is used in normal operation of the circuit, also is re-converted to digital form by a digital to analog converter and compared to the corresponding stored signal that was placed at the input of the filter. Specifically, the corresponding filter input and output signals are compared to each other to determine the frequency response of the filter. If the difference between the two signals is not what was expected based on the desired frequency response of the tunable filter, the filter characteristics are tuned accordingly and another set of data sample is processed in the same manner. Accordingly, the filter is tuned using the actual data signals without the need for an independently generated test pattern, extra clock cycles, or the use of multiple parallel filters.

DETAILED DESCRIPTION OF PREFERRED EMBODIMENTS OF THE INVENTION

In a preferred embodiment, the present invention includes a digital signal processor (DSP), a digital to analog converter (DAC) and an analog to digital converter (ADC) to tune a tuneable analog filter. The invention is particularly adapted for use in circuits in which these components are already embodied for purposes of performing other functions. Accordingly, there will be virtually no overhead circuitry for tuning the analog filter. Even further, the invention is particularly adapted to test the operation of a tunable analog filter using the actual data signals that pass through the filter in normal operation, eliminating the need for a test signal generator or overhead clock cycles.

Figure 1:
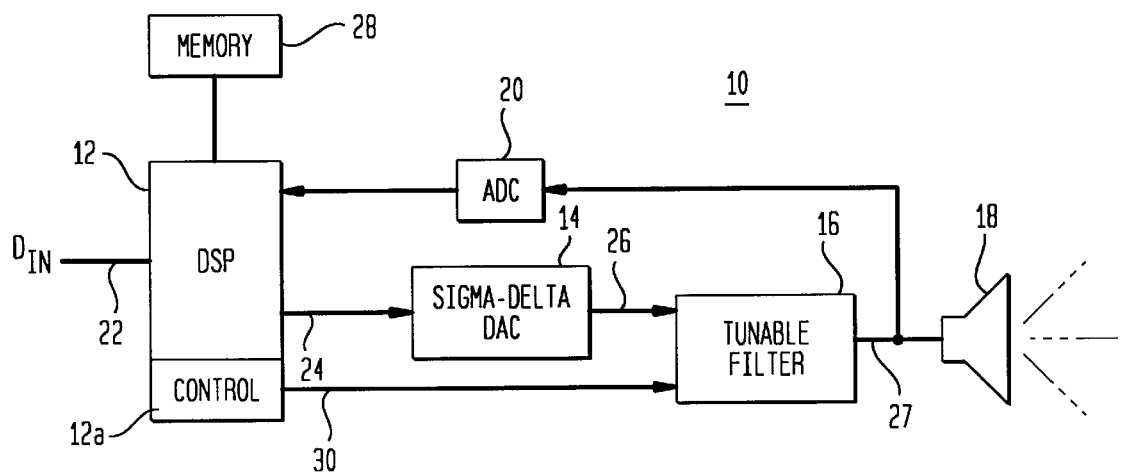
FIG. 1 is a block diagram of a tunable filter apparatus in accordance with the present invention.

FIG. 1 is a block diagram illustrating a general embodiment of the present invention. The circuit 10 comprises a digital signal processor 12 which is coupled to received a digital data input signal 22 that is to be digitally processed and converted to analog form for output to other circuitry or to an output device, such as speaker 18. As an example, the digital signal processor 12 may perform digital filtering and/or frequency shifting on the digital input signal 22. The output signal 24 thereof which is intended for output device 18 is forwarded to a digital to analog converter (DAC), such as sigma-delta DAC 14. The analog output signal 26 of DAC 14 is forwarded to the input of a tunable analog filter 16. As an example, if the particular application is a digital cellular telephone, tunable filter 16 might be a low pass filter with a desired cut off frequency at 4 KHz. The cut off frequency may be considered the frequency at which a sinusoidal signal at that frequency will be attenuated three decibels by the filter (i.e. the −3 dB point). The −3 dB point is a common, but essentially arbitrary, criterion for characterizing the frequency response of filters. It should be understood that this is merely an example and that any frequency characteristic of the filter may be used in the present invention to test the frequency response of the filter.

The output 27 of the filter is coupled to further circuitry or to an output device, such as telephone speaker 18 illustrated in FIG. 1. The output 27 also is fed back to the digital signal processor 12 through an analog to digital converter 20.

The digital signal placed on line 24 at the input of DAC 14 also is stored in memory. The digital data may be stored before, during, or even after the data is converted by the DAC 14. However, in most practical applications, it is likely that it will be most efficient to write the digital words to memory at the same time that they are being forwarded to the DAC 14 for conversion. The memory may be in the DSP or may be a separate memory, such as memory 28 illustrated in FIG. 1. Each digital sample output on line 24 may be stored in the memory (temporarily, as more fully described below). However, more preferably, discrete sets of consecutive digital output signals on line 24 may be stored. For example, 1024 consecutive samples (about 0.025 second assuming a 40 KHz data rate) may be stored at 10 second intervals. This stored data is hereinafter referred to as the stored digital data or stored digital samples.

Since the input signal to the filter 16 is known (i.e., it is the stored digital data in memory 28, as just described) and the desired frequency characteristic of the filter 16 is known, then the expected output signal is easily determined. The analog to digital converter 20 is controlled to convert the output of the converter 16 corresponding to the 1024 samples of the input to the filter which were stored in memory 28 (hereinafter referred to as the filtered digital data or filtered digital samples). For example, the approximately 0.025 second interval for operation of the ADC may simply be displaced one clock cycle from the approximately 0.025 second interval for recording the output of the DAC, assuming that the analog filter circuitry between the DAC 14 and the ADC 20 does not have a propagation delay greater than one clock cycle. If necessary, the filtered digital samples also may be stored in memory 28. However, if a buffer memory of sufficient size is available in the DSP 12, it may not be necessary to utilize the memory 28 to store the filtered digital data since, preferably, the data will be processed immediately.

The set of 1024 filtered digital samples can be compared with the corresponding 1024 digital samples to determine if the filtered digital samples are as expected based on the stored digital samples and the known desired frequency response of the filter 16.

In a preferred embodiment of the invention, the comparison is performed in the frequency domain. Particularly, in a preferred embodiment, the DSP 12 retrieves the corresponding sets of stored digital and filtered digital samples from the memory 28 and separately performs a Discrete Fourier Transform (DFT) on each set to determine the frequency components of the two signals. The Fourier Transform frequency spectrums of the stored digital and filtered digital signals, respectively, are compared to each other to determine if the frequency response of the filter 16 is as desired. Specifically, the frequency bins of the stored digital and filtered digital signal corresponding to frequencies below the desired cut off frequency of the filter should be essentially equal for the stored digital and filtered digital sample sets. However, the corresponding frequency bins of the filtered digital signals corresponding to frequencies above the cut off frequency of the filter 16 should be attenuated relative to the same frequency bins of the stored digital signal in a ratio dictated by the desired frequency response curve of the filter. If the comparison shows that the filter does not have the desired frequency attenuation characteristics, the filter 16 is out of tune and should be tuned.

It is not necessary that a full Fourier Transform be performed on the two sample sets. In many instances, it may be sufficient to select one or more particularly relevant frequency bins and perform the Fourier Transform algorithm with respect only to those bins. For example, in many instances it may be sufficient to assume that if the −3 dB point is properly located, that the remainder of the frequency response of the filter also is accurate. Accordingly, it may be desirable to perform the Fourier Transform only with respect to the one frequency bin corresponding to the desired −3 dB point. In other embodiments, it may be advisable, for instance, to perform the Fourier transform with respect to three frequency bins, namely, the one just below the −3 dB point, one at the −3 dB point, and one slightly above the −3 dB point.

The DSP 12 includes control circuitry 12a for controlling the tunable elements of the filter 16 via control line 30. The actual tuning of the tunable filter may be performed in any known manner, such as switching in or out circuit components, including resistors and/or capacitors or adjusting the control voltage on a MOSFET utilized as a resistor.

In high fidelity applications, it may be desirable to add to the actual data signal a frequency component above the desired cut off frequency of the filter in order to assure that there is a frequency component in the stored digital signal well above the cut off frequency which can be compared with the filtered digital signal to assure that the high frequency signal is being eliminated by the filter. In audio applications, this frequency may be above 20 KHz so that it is undetectable to the human ear and, therefore, would not detrimentally affect the audio quality even if the filter was not working properly.

Figure 2:
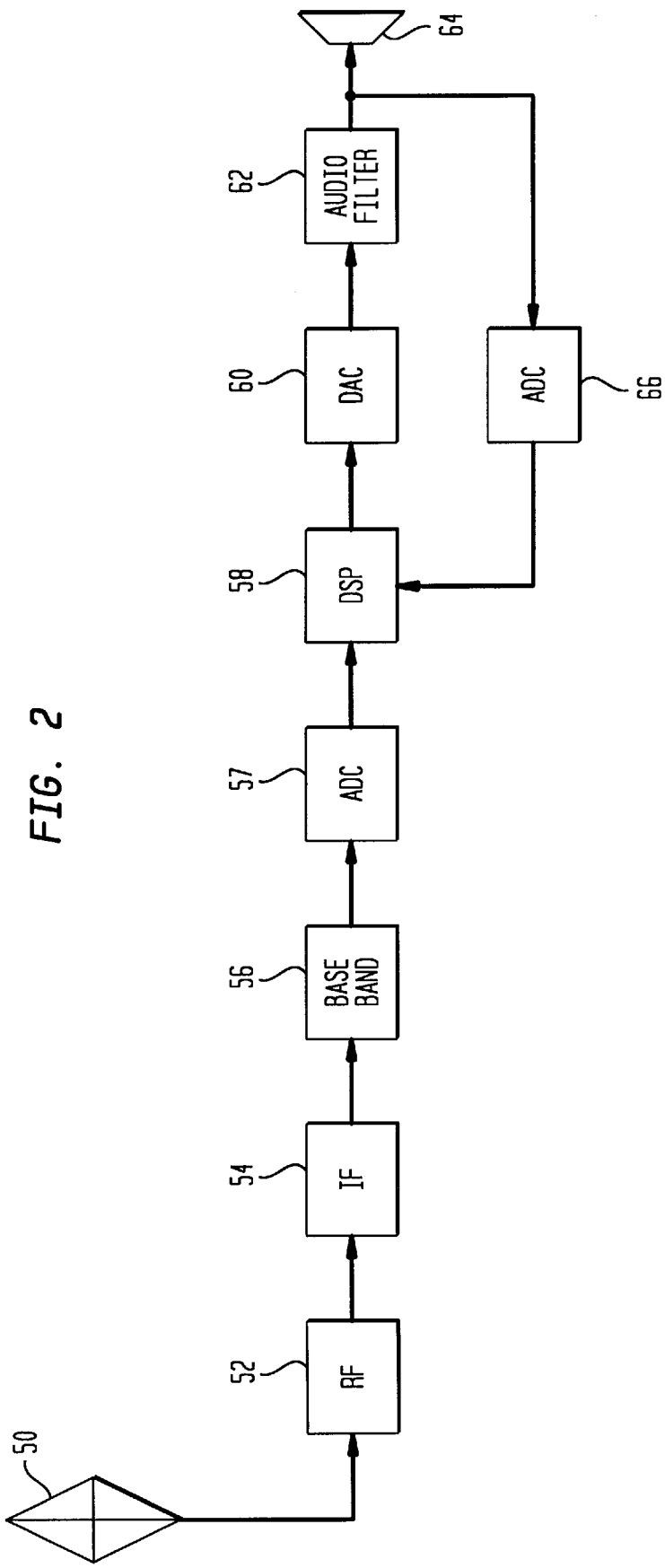
FIG. 2 is a block diagram illustrating a tunable filter apparatus in accordance with the present invention as embodied in a first type of electronic apparatus.

FIG. 2 is a block diagram of an exemplary cellular telephone receive data path employing an embodiment of the present invention. In particular, a radio frequency (RF) signal is received by the antennae 50. It is then passed through an RF filter circuit 52 in order to eliminate noise and spurious signals outside of the RF frequency band of interest. The RF filter is followed by an intermediate frequency (IF) filter circuit 54. Circuit 54 includes heterodyning circuitry for shifting the RF frequency signal down to a much lower intermediate frequency and further filtering it. The IF filter circuit 54 may also include circuitry for eliminating one of the side bands of a double side band received signal. A base band filter circuit 56 follows in order to further shift the data signal down to the base band, which, in the case of cellular telephone communications, is 0–4 KHz. The base band signal is then converted to digital form by an analog-to-digital converter 57 and input to a digital signal processor 58 for digital filtering and further digital signal processing. A portion of it also is stored in a memory in accordance with the present invention. The digital output of the DSP 58 is forwarded to a digital to analog converter 60 and, therethrough, to an audio filter 62. The output of the audio filter is forwarded to a telephone speaker 64 as well as fed back to the digital signal processor 58 through an analog to digital converter 66 for comparison in accordance with the present invention as described above in connection with FIG. 1. The digital signal processor 58 contains programming for running the comparison between the stored digital and filtered digital signals to the analog filter and controlling the tunable filter responsive thereto.

Figure 3:
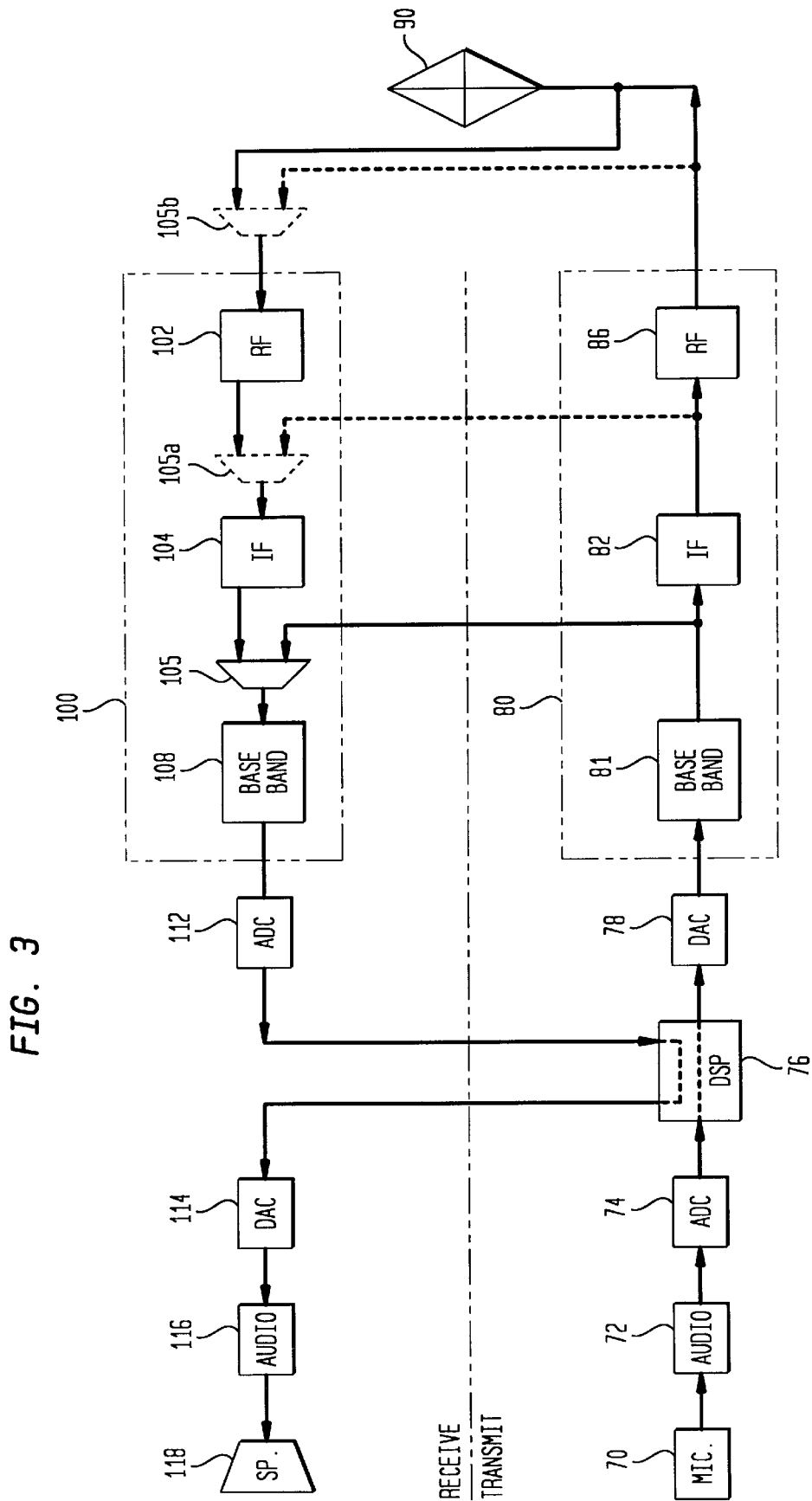
FIG. 3 is a block diagram illustrating a tunable filter apparatus in accordance with a second embodiment of the invention.

FIG. 3 shows another embodiment of the present invention in which the inventive concept is used to simultaneously tune filters in both the receive data path and the transmit data path of a cellular telephone. In particular, the transmit data path comprises a microphone 70 followed by an analog audio filter 72 to limit the signal to the 0–4 KHz frequency range. The filter 72 is followed by a analog to digital converter 74 which converts the analog signal to digital and feeds it to the digital signal processor 76. Digital signal processor 76 performs digital signal processing and digital filtering of the data signal and outputs it to a digital to analog converter 78. The digital data samples that the DSP generates and forwards to the DAC 78, or at least a discrete portion thereof, also are stored in a memory (hereinafter the "stored digital test samples").

The DAC 78 is followed by transmit channel circuitry 80 which modulates the base band signal onto a radio frequency carrier wave. The transmit channel circuitry includes a base band filter circuit 81. It also includes an intermediate frequency circuit 82 that amplifies and shifts the data content to an intermediate frequency, e.g., 70 MHz, and also includes an intermediate frequency filter for eliminating spurious noise. The transmit data path 80 further includes an RF frequency transmitter 86 that further shifts the data content to the RF transmit frequency, e.g., 900 MHz, and includes an RF frequency filter 88 to eliminate spurious RF frequency noise. The output of the RF frequency transmitter is coupled out to the antenna 90 for transmission.

The receive channel includes a receive data path 100 that receives incoming RF frequency signals from the antenna 90. The receive data path comprises circuitry generally parallel to that found in the transmit data path. Particularly, data received from the antenna 90 is fed to an RF filter 102 that filters for the signal carrier frequency. An IF filter circuit 104 frequency downshifts the filtered RF signal to the intermediate frequency and eliminates unwanted interfering signals. The IF filter circuit includes an IF filter for filtering the intermediate frequency signal. The output of the IF circuit 104 is passed through multiplexer 105 to a base band circuit 108 which further frequency down converts the IF signal to the base band. The base band circuit includes a base band filter. The base band signal is converted to digital format by an analog to digital converter 112 and forwarded to the DSP 76. The DSP digitally processes the signal, including signal filtering. The digitally processed signal is reconverted to analog format by DAC 114 and placed at the input to an analog audio filter 116 and, therethrough, to the telephone speaker 118.

During transmit operation of the digital telephone transceiver, the receive data path circuitry would normally lie idle. However, in accordance with the present invention, the transmit and receive data path filters can be tuned during transmit operation of the transceiver.

Specifically, during transmit operation, the output of DAC 78 also is fed into the receive data path at an intermediate point therein through multiplexer 84. In FIG. 3, for example, multiplexer 105 is positioned between the intermediate frequency and base band receive data path sections. However, as will become clear, the input and output terminals of the multiplexer can be coupled at any of numerous positions in the transmit and receive data paths.

During receive operation of the transceiver, the multiplexer 105 is programmed to pass the receive data at its (a) input terminal from the IF circuit to the base band circuit. However, during transmit operation, multiplexer 105 is programmed to select the signal at its (b) input from the transmit data path. The output of the base band filter is forwarded to the digital signal processor 76 in either event, as previously described. However, during transmit operation, rather than digitally processing the data and passing it on to the audio filter and speaker, the DSP 76 stores the data samples corresponding to the stored digital test samples (hereinafter the "filtered digital test samples")

and performs a comparison of the stored digital test samples with the filtered digital test samples, as previously described.

With appropriate control hardware or software in the DSP for implementing test processing in accordance with the present invention, the base band filters in both the receive and transmit data paths can be tuned. In particular, as can be seen from FIG. 3, the data is passed through the base band filter in the transmit data path and the base band filter in the receive data path. Thus, the difference in frequency content between the stored digital test samples and the filtered digital test samples is a function of the frequency response of the receive data path base band filter and the transmit data path base band filter.

Both of these filters can be tuned simultaneously based on the difference between the stored digital and the filtered digital signals. Although there is no way to distinguish between what differences between the stored digital and filtered digital test samples are attributable to each of these two filters, in most situations, it will be safe to assume that the two filters are more or less identical (except for any differences that might exist due to the filters being tuned differently). With this assumption and the knowledge of how each of the two filters is tuned at any particular moment in time, in most cases, one can most likely accurately assume the characteristic of each filter individually.

Even further, even if this assumption cannot be made, the tuning algorithm can be designed so as to individually tune one of the two filters responsive to a test sample set and determine how the change to the one filter affects the frequency response of the next test sample set. In this way, the component of the overall frequency response of the two filters attributable to each of the filters can, at least to a large extent, be determined and, therefore, the filters tuned individually.

It is even further possible to move the position of the multiplexer even further out into the receive and/or transmit data paths to include even further filters, such as the IF filters. The position of multiplexer 105a shown in dotted outline on FIG. 3 illustrates such an embodiment.

In this embodiment, the frequency responses of four filters, i.e., the base band receive filter, the intermediate frequency receive filter, the intermediate frequency transmit filter, and the base band transmit filter, will all contribute to the measured difference between the stored digital and filtered digital signals. As discussed above with respect to the embodiment using multiplexer 105 in FIG. 3, with certain assumptions and/or changes to individual filters between sample sets, the frequency characteristics of each of the individual filters can, at least to a large part, be determined, even though frequency response characteristics of each of the filters are not tested individually.

Multiplexer 105b, shown in dashed outline in FIG. 3, illustrates a further possible embodiment in which all of the filters in the transmit and receive data paths are tested simultaneously.

Figure 4:
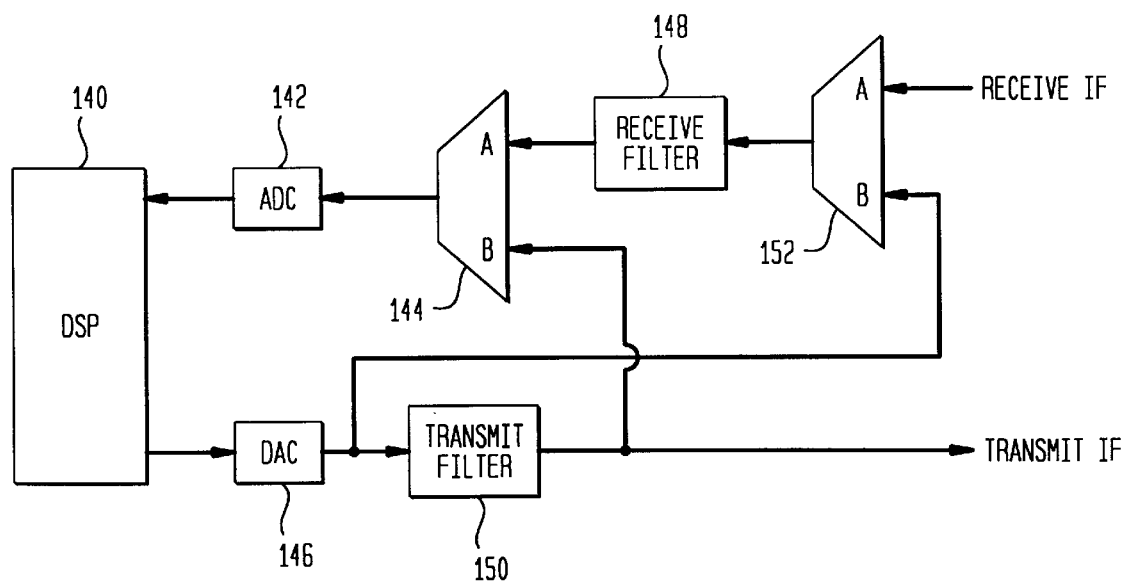
FIG. 4 is a block diagram illustrating a tunable filter apparatus in accordance with a third embodiment of the invention.

The invention can be used to test almost any combination of one or more filters simultaneously. For instance, FIG. 4 shows an embodiment in which either the receive path filter or the transmit path filter can be alternately tested individually.

To test the receive filter 148, multiplexer 152 is set to accept its (b) input, while multiplexer 144 is set to accept its (a) input. Thus, the signal output from the DSP 140 is fed from the DSP 140 to the DAC 146 and directly to the receive filter 148 and back into the DSP 140 without passage through any frequency altering circuitry other than the receive filter 148. To test the transmit filter 150, multiplexer 144 is, instead, set to accept its (b) input, while the setting of multiplexer 152 is irrelevant since the data through multiplexer 152 does not reach the DSP in either event. In this mode, the output of the DSP 140 is converted to digital by the DAC 146, passes through the transmit filter 150 is returned to the DAC though multiplexer 144 and ADC 142 without passage through any frequency altering circuitry other than the transmit filter.

While the comparison method utilizing Fourier Transforms as discussed above is the preferred way to compare the stored digital and filtered digital test signals, it should be understood that any other reasonable comparison may be made between the two signals. For instance, a comparison in accordance with the above description of a disclosed embodiment from aforementioned U.S. patent application Ser. No. 08/502,591 is an alternate possibility. However, that method involves the use of separately generated test signals, and, therefore, requires a test signal generator and additional clock cycle overhead as previously noted. Another alternative would be to use a very narrow, sharp bandpass filter to pick out a single frequency component (e.g., the desired cut-off frequency) and compare the "before" and "after" signals in that narrow band.

The present invention may be utilized for repeatedly tuning a filter or filters during operation, as described above. Further, it can be used for a one-time tuning operation at the end of fabrication or by an OEM. In such embodiments, the tunable filter may be a programmable filter in which the capacitors and/or resistors of the filter are switched in or out of circuit connection. The capacitor switching may be implemented, for instance, by one-time fuses or by a control data word stored in a flash memory. It also is possible to use a DAC to generate control voltages for controlling MOSFET-C or Gm-C type filters. Again, the control voltages may be stored in a flash memory, for instance.

It is envisioned that, for portable, battery-operated devices, a flash memory programmable tunable filter may be utilized in an embodiment in which the filter or filters are tuned each time the device is plugged into an AC outlet to recharge the battery or to run on AC power rather than battery power.

The present invention may be used to tune any type of analog filter, including sigma-delta filters.

Having thus described a few particular embodiments of the invention, various other alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:

1. A method of tuning a frequency response of an analog filter in a circuit for processing digital data, converting said digital data to analog data and filtering said analog data in said analog filter and transmitting said data, said method comprising the steps of:

storing said digital data;

converting said digital data to analog data;

filtering said analog data with said analog filter to generate filtered analog data;

transmitting said filtered analog data;

converting said filtered analog data to digital data, termed filtered digital data;

comparing said stored digital data with said filtered digital data to determine a difference therebetween;

determining a frequency response of said analog filter from said difference; and tuning said analog filter, if said frequency response is not within a predetermined tolerance of a specified frequency response.

2. A method as set forth in claim 1 wherein said comparing step comprises:

performing a Fourier Transform on said digital data;

performing a Fourier Transform on said filtered digital data; and comparing said Fourier Transforms to each other.

3. A method as set forth in claim 2 wherein said steps of performing Fourier Transforms comprise calculating a value for all possible frequency bins.

4. A method as set forth in claim 2 wherein said steps of performing Fourier Transforms comprises calculating a value for only one frequency bin.

5. A method as set forth in claim 4 wherein said one frequency bin corresponds to a cutoff frequency of said filter.

6. A method as set forth in claim 2 wherein said steps of performing Fourier Transforms comprises calculating values for only three frequency bins comprising a first bin corresponding to a desired cutoff frequency of said analog filter, a second bin corresponding to a frequency below said cutoff frequency and a third bin corresponding to a frequency above said cutoff frequency.

7. A method as set forth in claim 1 wherein said digital data is telecommunications data.

8. A method as set forth in claim 1 wherein said method is performed in a cellular telecommunications device.

9. A method as set forth in claim 8 wherein said digital data is voice data.

10. A method as set forth in claim 1 wherein said storing step comprises storing a discrete set of consecutive samples of said digital data and said comparing step comprises comparing said discrete set of samples of said digital data with a corresponding discrete set of samples of said filtered digital data.

11. A method as set forth in claim 2 wherein said storing step comprises storing a discrete set of consecutive samples of said digital data and said comparing step comprises comparing said discrete set of samples of said digital data with a corresponding discrete set of samples of said filtered digital data.

12. A method of tuning a frequency response of a plurality of analog filters in a transceiver device, said transceiver device having a transmit data path with at least one analog filter and a receive data path with at least one analog filter, said method comprising the steps of:

generating in a digital processing device transmit digital data for transmission;

storing said transmit digital data;

converting said transmit digital data to analog data;

transmitting said analog data through said transmission data path;

coupling said analog data from a point in said transmit data path subsequent to said analog filter into said receive data path at a point prior to said receive data path analog filter whereby said analog data will pass through at least a portion of said receive data path, including said receive data path analog filter;

converting said filtered analog data to digital data, termed receive digital data;

comparing said stored transmit digital data with said receive digital data to determine a difference therebetween;

determining a collective frequency response of said receive data path analog filter and said transmit data path analog filter from said difference; and tuning said transmit data path analog filter and said receive data path analog filter, if said collective frequency response is not within a predetermined tolerance of a specified frequency response.

13. A method as set forth in claim 12 wherein said tuning step comprises tuning one of said transmit data path analog filter and said receive data path analog filter responsive to said difference and repeating the steps of claim 12 to determine the effect of said tuning step on said collective frequency response.

14. A method as set forth in claim 12 wherein said comparing step comprises:

performing a Fourier Transform on said transmit digital data;

performing a Fourier Transform on said receive digital data; and comparing said Fourier Transforms to each other.

15. A method as set forth in claim 14 wherein said steps of performing Fourier Transforms comprise calculating a value for only one frequency bin, said one frequency bin corresponding to a cutoff frequency of at least one of said analog filters.

16. A method as set forth in claim 14 wherein said steps of performing Fourier Transforms comprises calculating values for only three frequency bins comprising a first bin corresponding to a desired cutoff frequency of at least one of said analog filters, a second bin corresponding to a frequency below said cutoff frequency and a third bin corresponding to a frequency above said cutoff frequency.

17. A method as set forth in claim 12 wherein said method is performed in a cellular telecommunications device.

18. A method as set forth in claim 14 wherein said storing step comprises storing a discrete set of consecutive samples of said transmit digital data and said comparing step comprises comparing said discrete set of samples of said digital data with a corresponding discrete set of samples of said filtered digital data.

19. A method of tuning a frequency response of an analog filter comprising the steps of:

storing digital data in a memory;

converting said digital data to analog data;

filtering said analog data with said analog filter to generate filtered analog data;

converting said filtered analog data to digital data, termed filtered digital data;

performing a Fourier Transform on said digital data;

performing a Fourier Transform on said filtered digital data;

comparing said Fourier Transforms to each other to determine a difference therebetween;

determining a frequency response of said analog filter from said difference; and tuning said analog filter, if said frequency response is not within a predetermined tolerance of a specified frequency response.

20. A method as set forth in claim 19 wherein said steps of performing Fourier Transforms comprise calculating a value for all possible frequency bins.

21. A method as set forth in claim 19 wherein said steps of performing Fourier Transforms comprises calculating a value for only one frequency bin.

22. A method as set forth in claim 21 wherein said one frequency bin corresponds to a cutoff frequency of said analog filter.

23. A method as set forth in claim 19 wherein said steps of performing Fourier Transforms comprises calculating values for only three frequency bins comprising a first bin corresponding to a desired cutoff frequency of said analog filter, a second bin corresponding to a frequency below said cutoff frequency and a third bin corresponding to a frequency above said cutoff frequency.

24. An apparatus for tuning a frequency response of an analog filter comprising:

a digital processor coupled to said analog filter and capable of tuning a frequency response of said analog filter;

a memory coupled to said digital processor to receive and store digital data from said digital processor;

a digital to analog converter coupled to receive said digital data from said digital processor and convert it to analog data;

an analog filter coupled to receive said analog data from said digital to analog converter; and an analog to digital converter coupled to receive analog data from said filter and convert it to digital data, termed filtered digital data, said analog to digital converter coupled to provide said filtered digital data to said digital processor; and wherein said digital processor retrieves said stored digital data from said memory, performs a Fourier Transform on said digital data and said filtered digital data, compares said Fourier Transforms to each other to determine a frequency response of said analog filter, and tunes said analog filter, it said frequency response is not within a predetermined tolerance of a specified frequency response.

25. An apparatus as set forth in claim 24 wherein said digital processor calculates and compares the Fourier Transforms corresponding to only one frequency bin.

26. A method as set forth in claim 25 wherein said one frequency bin corresponds to a cutoff frequency of said filter.

27. A method as set forth in claim 24 wherein said digital processor calculates and compares said Fourier Transforms corresponding to only three frequency bins comprising a first bin corresponding to a desired cutoff frequency of said analog filter, a second bin corresponding to a frequency below said cutoff frequency and a third bin corresponding to a frequency above said cutoff frequency.

28. A method as set forth in claim 24 wherein said digital processor compares a discrete set of consecutive samples of said digital data and compares said discrete set of samples of said digital data with a corresponding discrete set of samples of said filtered digital data.

29. A cellular telecommunications apparatus for processing digital data, converting said digital data to analog data, filtering said analog data in an analog filter with a tunable frequency response, and transmitting said data for reception by another cellular telecommunications apparatus, said apparatus comprising:

a digital processor coupled to said analog filter and capable of tuning said frequency response of said analog filter;

a digital to analog converter coupled to receive said digital data from said digital processor and convert it to analog data;

a transmission data path, coupled to receive said analog data from said digital to analog converter, for transmitting said analog data to another cellular communications apparatus, said transmission data path including an analog filter;

an analog to digital converter coupled to receive analog data from said filter and convert it to digital data, termed filtered digital data, said analog to digital converter coupled to provide said filtered digital data to said digital processor;

wherein said digital processor retrieves said stored digital data from said memory, compares said stored digital data with said filtered digital data to determine a difference therebetween, determines a frequency response of said analog filter from said difference, and tunes said analog filter, if said frequency response is not within a predetermined tolerance of a specified frequency response.

30. An apparatus as set forth in claim 29 wherein said digital processor performs Fourier Transforms on said digital data and said filtered digital data, respectively, and compares said Fourier Transforms to each other.

31. A cellular telecommunications apparatus for processing digital data, converting said digital data to analog data, filtering said analog data in an analog filter with a tunable frequency response, and transmitting said data for reception by another cellular telecommunications apparatus, said apparatus comprising:

a digital processor coupled to said analog filter and capable of tuning said frequency response of said analog filter;

a digital to analog converter coupled to receive said digital data from said digital processor and convert it to analog data;

a transmission data path, coupled to receive said analog data from said digital to analog converter, for transmitting said analog data to another cellular communications apparatus, said transmission data path including an analog filter;

an analog to digital converter coupled to receive analog data from said filter and convert it to digital data, termed filtered digital data, said analog to digital converter coupled to provide said filtered digital data to said digital processor;

means within said digital processor for comparing said stored digital data with said filtered digital data to determine a difference therebetween;

means within said digital processor for determining a frequency response of said analog filter from said difference; and means within said digital processor for tuning said analog filter, if said frequency response is not within a predetermined tolerance of a specified frequency response.

32. An apparatus as set forth in claim 31 further comprising;

means for performing a Fourier Transform on said digital data;

means for performing a Fourier Transform on said filtered digital data; and wherein said means for comparing compares said Fourier Transforms to each other.

33. A method as set forth in claim 31 wherein said digital data is voice data.

34. A method as set forth in claim 31 wherein said means for comparing comprises means for comparing a discrete set of samples of said digital data with a corresponding discrete set of samples of said filtered digital data.

35. An integrated circuit capable of tuning a frequency response of an analog filter comprising:
- a digital processor coupled to said analog filter and capable of tuning a frequency response of said analog filter;
- a memory coupled to said digital processor to receive and store digital data from said digital processor;
- a digital to analog converter coupled to receive said digital data from said digital processor and convert it to analog data;
- an analog filter coupled to receive said analog data from said digital to analog converter; and
- an analog to digital converter coupled to receive analog data from said filter and convert it to digital data, termed filtered digital data, said analog to digital converter coupled to provide said filtered digital data to said digital processor; and
- wherein said digital processor retrieves said stored digital data from said memory, performs a Fourier Transform on said digital data and said filtered digital data, compares said Fourier Transforms to each other to determine a frequency response of said analog filter, and tunes said analog filter, if said frequency response is not within a predetermined tolerance of a specified frequency response.

36. An apparatus as set forth in claim 35 wherein said digital processor calculates and compares the Fourier Transforms corresponding to only one frequency bin.

37. An apparatus as set forth in claim 35 wherein said analog filter in comprises within said integrated circuit.

* * * * *